(12) United States Patent
Oestlund et al.

(10) Patent No.: US 11,993,840 B2
(45) Date of Patent: May 28, 2024

(54) ASYNCHRONOUS CONVERSION OF METALS TO METAL CERAMICS

(71) Applicant: Newsotech, Inc., Ashburn, VA (US)

(72) Inventors: Peter Oestlund, Mora (SE); Mats Vikstroem, Taeby (SE); Timothy Hamblin-Smith, Naes (SE)

(73) Assignee: Intalus, Inc., Ashburn, VA (US)

( * ) Notice: Subject to any disclaimer, the term of this patent is extended or adjusted under 35 U.S.C. 154(b) by 531 days.

(21) Appl. No.: 17/350,387

(22) Filed: Jun. 17, 2021

(65) Prior Publication Data

US 2022/0042169 A1 Feb. 10, 2022

(51) Int. Cl.
| | | |
|---|---|---|
| *C23C 14/58* | (2006.01) | |
| *C21D 1/06* | (2006.01) | |
| *C23C 14/16* | (2006.01) | |
| *C23C 16/06* | (2006.01) | |
| *C23C 16/56* | (2006.01) | |

(52) U.S. Cl.
CPC ............ *C23C 14/5873* (2013.01); *C21D 1/06* (2013.01); *C23C 14/16* (2013.01); *C23C 14/5806* (2013.01); *C23C 16/06* (2013.01); *C23C 16/56* (2013.01)

(58) Field of Classification Search
CPC . C23C 14/5873; C23C 14/16; C23C 14/5806; C23C 16/06; C23C 16/56; C23C 4/08; C23C 8/02; C23C 8/24; C23C 8/80; C23C 24/082; C23C 28/04; C23C 28/322; C23C 28/343; C21D 1/06; C21D 9/46; C21D 1/09; B33Y 10/00
See application file for complete search history.

(56) References Cited

U.S. PATENT DOCUMENTS

| | | |
|---|---|---|
| 2007/0157475 A1 | 7/2007 | King et al. |
| 2010/0035051 A1 | 2/2010 | Yilbas |
| 2013/0188003 A1 | 7/2013 | Thaker |
| 2020/0066449 A1 | 2/2020 | Tsutsumi |

*Primary Examiner* — Jessee R Roe
(74) *Attorney, Agent, or Firm* — Da Vinci's Notebook, LLC

(57) ABSTRACT

A metal-ceramic article and method for creating the same is disclosed in which the article has undergone machining to remove outer surface volume. The intermediate layer of the article includes a gradient of a metal and metal-ceramic that diminishes toward a metal core.

9 Claims, 11 Drawing Sheets

FIG. 17
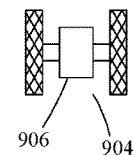
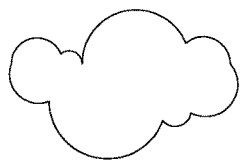
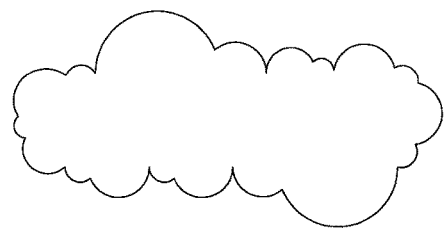
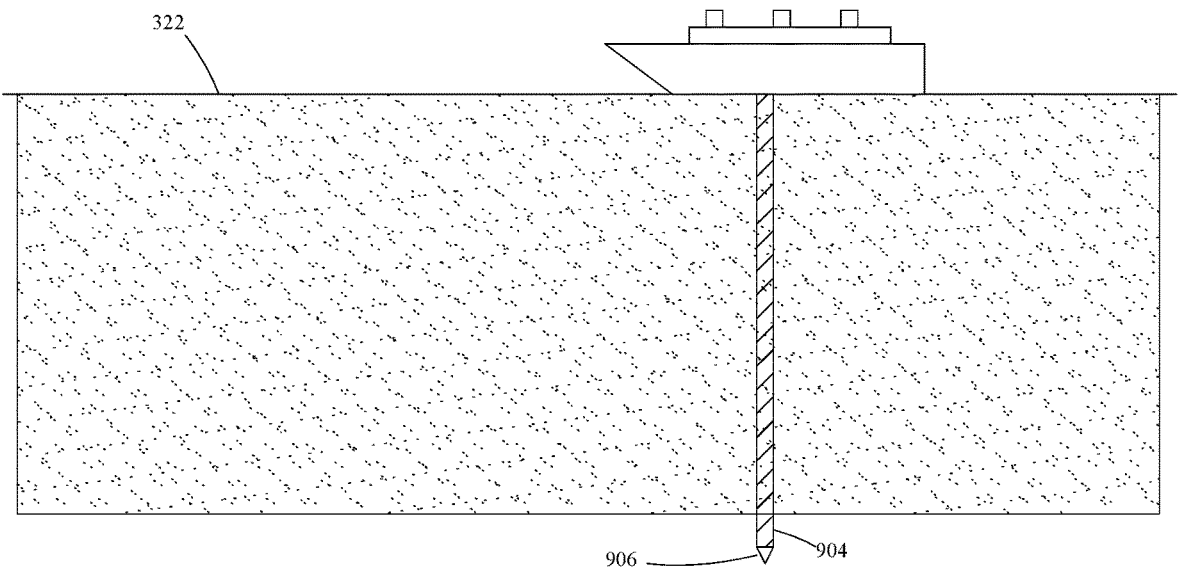

FIG. 18A
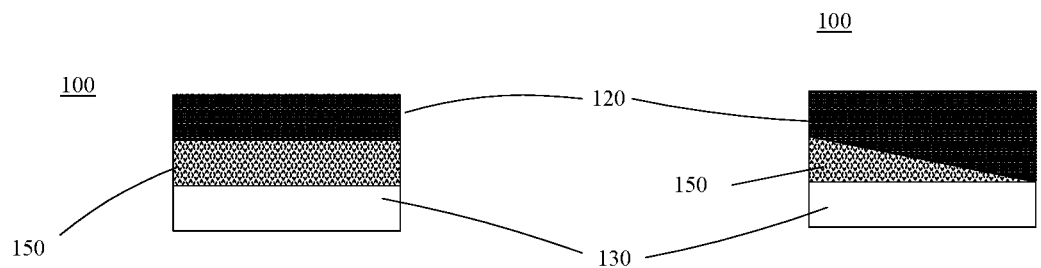
FIG. 18B
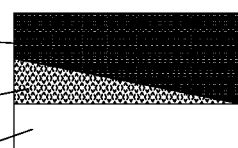
FIG. 18C
FIG. 18D
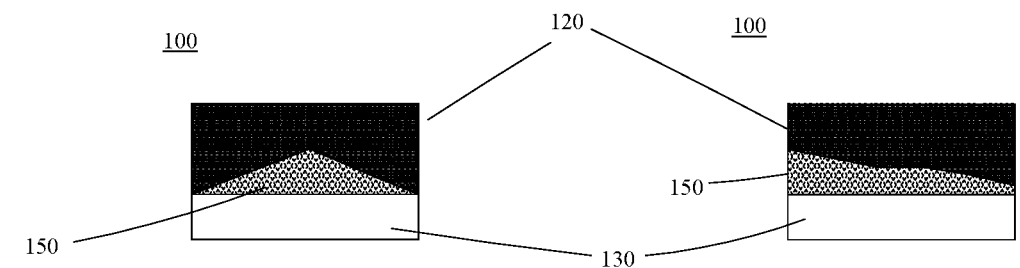

ASYNCHRONOUS CONVERSION OF METALS TO METAL CERAMICS

TECHNICAL FIELD

The present invention generally concerns a method of treating a workpiece comprising titanium or other metal to result in a metal ceramic.

BACKGROUND OF THE INVENTION

Titanium has found an increasing use in various technical fields such as in the manufacturing of machine parts and other components within the automotive, aerospace, mining, medical and other industries. In practice, chemically pure titanium is not utilized industrially but the titanium is alloyed to form various alloys with differing characteristics. Examples of some frequently used titanium alloys are so called commercially pure (cp) titanium or Grade 2 titanium (sometimes referred to as unalloyed), Grade 5 titanium (Ti-6Al-4V) and Grade 9 titanium (Ti-3Al-2.5V). In the following description also the so called commercially pure titanium metal is referred to as alloy.

The titanium alloys generally have some characteristics that are favourable in many applications. Examples of such characteristics are low density, high specific strength or strength-to-weight ratio, excellent corrosion resistance and ability to withstand high temperatures. The low density and high specific strength e.g. contributes to reduce energy consumption and environmental impact when producing machine parts and other components. Some titanium alloys are also non-toxic which is used e.g. for producing orthopaedic and dental prosthesis and implants. However, one technical disadvantage of titanium alloys is the risk of adhesive seizure in highly loaded sliding or rolling contacts.

Several methods have been developed in order to eliminate this disadvantage. Such known methods comprise different PVD (Physical Vapour Deposition) coatings and plasma sprayed coatings.

An emerging method is conversion of the titanium alloy surface by nitriding the titanium alloy. By this means, ceramic titanium nitrides such as δ-TiN (face-centered cubic) and ε-Ti2N (tetragonal) are formed in an outermost first surface layer portion of the work piece. The nitrides considerably increase the hardness and thereby the load-carrying capacity of the surface layer. In addition to forming nitrides in the outmost first ceramic layer portion, the nitriding process also results in a second metallic layer portion where nitrogen is diffused into the titanium alloy just beneath the ceramic layer. Typically the nitrogen concentration in this second layer portion is highest adjacent to the first nitride layer portion and is reduced gradually at increased depth from the surface, thereby forming a nitrogen gradient in the surface layer. The nitrogen gradient results in increased hardness and support of the first nitride layer portion.

This method is usually carried out by processing the workpiece in vacuum furnaces. The main limitations of these treatments are long and costly processes, resulting thin nitride layers and shallow penetration of nitrogen into the bulk metal, thereby forming merely a relatively weak support for the hard and brittle nitride layers.

SUMMARY OF THE INVENTION

Disclosed is a metal ceramic created through novel post-formation methods. An outer layer of the metal ceramic is transformed via physical conversion of the metal to the metal ceramic. The physical conversion occurs by waveform conversion in utilizing wave energy for localized conversion. The portions of the article converted do not form a discrete layer, but rather are converted into a gradient constituting a ratio of metal/ceramic.

Titanium is considered to be relatively expensive. Therefore, it is usually applied where its properties provide an explicit advantage. In the ambient atmosphere titanium instantly reacts with the oxygen creating titanium dioxide, TiO2. The general opinion on this oxide is it is very hard and thereby it is very wear resistant. The oxide also "seals" the titanium from further exposure to oxygen however, in the work to further the process of physical conversion of titanium, it has been noticed that older oxide is thicker and more "cumbersome" to handle. Because of historical reasons other vendors have been trying to copy the original process of physical conversion (reaction growth). Visual inspection of samples made from such vendors reveal a "camouflage" like pattern of different shades of the TiN colour across the surface. This is because the oxide layer is of varying thickness when the heat is applied to start the physical conversion of the surface. Rendering the nitrogen varying ability to access the titanium for the conversion reaction.

For all practical intents and purposes any vendor who wants to make a titanium component starts with a prefabricated bar, sheet or block of the titanium alloy. The provider of such prefabricated material adheres to a defined standard for the selected alloy. This is where the first consideration comes into focus. Providers of prefabricated alloys demonstrate a varying concern with quality. This is indicated in how well the ingredients, according to the standard, has been mixed to create isotropic properties across the whole volume of the prefabricated geometry. Buying material from a provider less concerned about the mixing quality can render a situation where the surface exhibit a varying degree of titanium. Hence, affecting the physical conversion. Also, in prefabricating bars, sheets, etc., the providers are usually using some "greasing" ingredients when shaping the titanium material into the desired shape. This "greasing" is essentially squeezed into the surface of the material. If any of the "greasing" ingredients remain on the surface it will impact the physical conversion process.

Machining the prefabricated material into the desired shape exposes "fresh" titanium to oxygen and an instant reaction occurs creating TiO2. In standard machining the surface needs to be improved upon. The most common approach to improve the surface finish is abrasive methods. However, as TiO2 is rather hard the abrasive methods tend to do two things. In the case when the abrasive media manage to pull the TiO2 of the surface the TiO2 usually remain in the area and interfere with the abrasive action. The result is an uneven TiO2 layer remain on the surface. The second case is that the abrasive media is unable to remove the TiO2 evenly as the abrasive media is not potent enough. The result is an uneven TiO2 layer remain on the surface. As has been mentioned above other vendors suffer from lack of this insight.

The present invention includes providing a metal-oxide workpiece having substantially isotropic metal-oxide attributes to a waste depth of said workpiece. Then a target volume of the workpiece is machined to shape the workpiece into a predetermined final article volume, composed of an original surface and a machined surface, having a substantially isotropic metal-oxide surface. Then coherent energy is emitted upon the machined surface for a duration sufficient to impart a comparable hardness between said original surface and the machined surface.

The present invention includes providing a metal-oxide workpiece having substantially isotropic metal-oxide attributes and bearing a superficial substantially organic adherent secondary chemical. The secondary chemical is removed to a large extent. Then a target volume of the workpiece is removed to shape the workpiece into a predetermined final article volume, composed of an original surface and a machined surface, having a substantially isotropic metal-oxide surface. In an ambient environment waste debris is excised from the final article volume and re-removing the secondary chemical. Then a substantially uniform metal oxide surface area immediately adjacent between said original surface and said machined surface the is applied to the final article.

The present invention includes providing a metal-oxide workpiece having substantially isotropic metal-oxide attributes to a waste depth of said workpiece. Then pulse ablating is applied in a substantially Nitrogenous environment a target volume of the workpiece to shape the workpiece into a predetermined final article volume, substantially free of waste debris, composed of an original surface and a machined surface, having a substantially isotropic metal-oxide surface. Then laser energy is emitted upon the machined surface for a duration sufficient to impart a comparable hardness between said original surface and said machined surface.

The present invention includes a metal ceramic article comprising a core, an intermediate layer, and an outer layer. The core consists of a metal alloy. The intermediate layer, envelopes the core, and consists of a mixture of the metal alloy and a nitrogen ceramic of the metal alloy arranged in a gradient of diminishing ceramic relative to the core. The ceramic is postformed from a composition consisting of the metal alloy. The outer layer, which envelopes the intermediate layer, consists of the nitrogen ceramic. The ceramic is postformed from the composition consisting of the metal alloy.

The present invention includes a metal ceramic article comprising a core, an intermediate layer, and an outer layer. The core consists of a metal alloy. There is an intermediate layer, enveloping the core, consisting of a mixture of the metal alloy and a nitrogen ceramic. The ceramic is postformed from a composition consisting of the metal alloy. There is an outer layer, which envelopes the intermediate layer, that is composed of an original surface and a machined surface hardness-accelerated in duration sufficient to impart a comparable hardness between the original surface and the machined surface.

The present invention includes a metal ceramic article comprising a core, an intermediate layer, and an outer layer. The core consists of a metal alloy. There is an outer layer, enveloping the core layer, composed of an original surface and a laser pulse-ablated surface, hardness-accelerated in duration sufficient to impart a comparable hardness between the original surface and the machined surface and having a substantially uniform hardness between the original surface and the ablated surface. The intermediate layer, between the core and the outer layer, consists of a mixture of the metal alloy and a nitrogen ceramic postformed from a composition consisting of the metal alloy at a substantially uniform depth between the original surface and the ablated surface.

The present invention can result in articles having significant utility across a myriad of fields and technologies. The use of laser application permits the creation of ceramic articles with bespoke configurations of ceramic that can be created with fine detail. The present invention results in articles that can be a combination of metal and metal ceramic not only from the vantage of surface-to-interior, but also on the surface itself. When ceramic conversion itself can be controlled with fine detail, the surface orientations can be mixtures and patterns of ceramics and non-ceramics, or replacement portions of ceramics that match pre-existing ceramic portions of an article.

BRIEF DESCRIPTION OF THE DRAWINGS

FIG. 17 is a view of articles of the present invention utilized in high stress environments.
FIG. 18A-D are views of articles of the present invention featuring

DETAILED DESCRIPTION OF EMBODIMENTS

Figure 1:
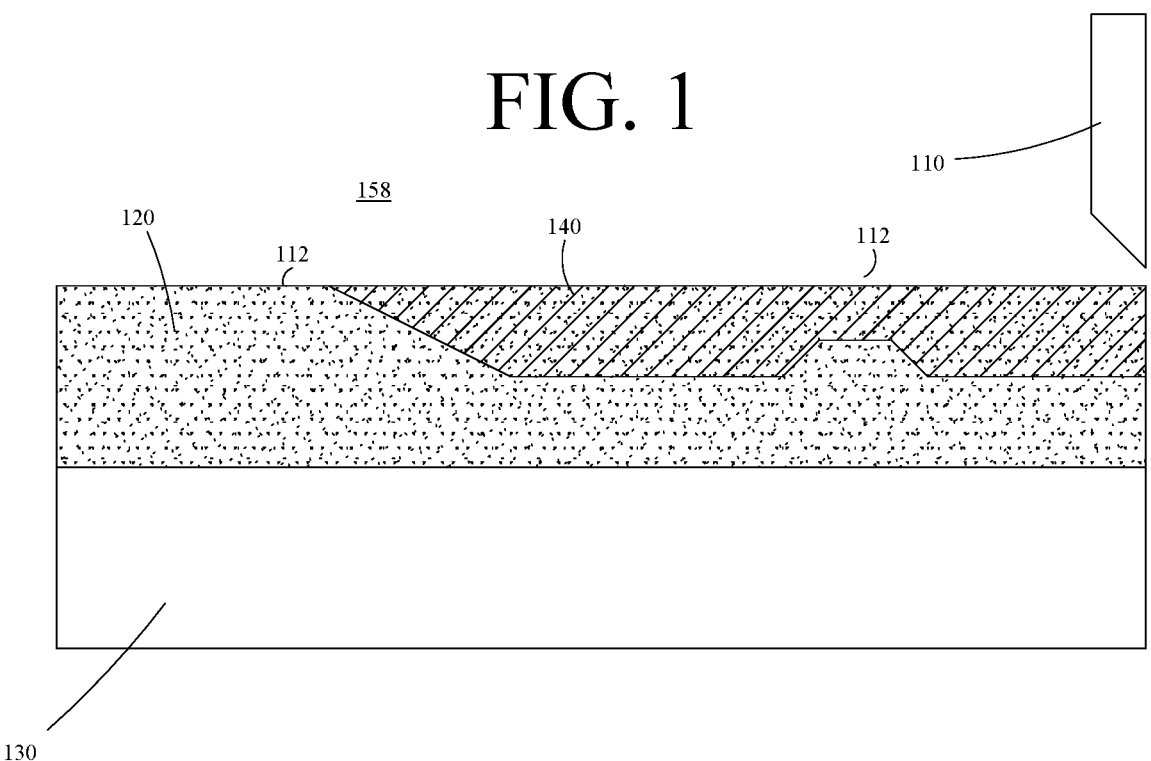
FIG. 1 is a view of an article of the present invention undergoing formation.
Figure 2:
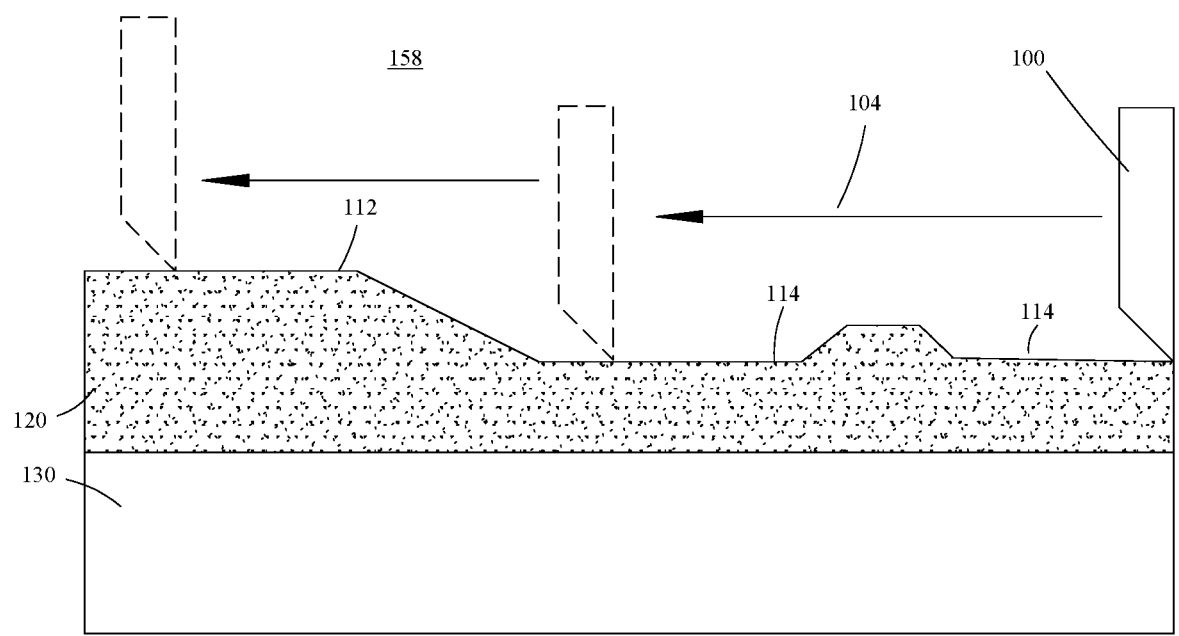
FIG. 2 is a view of an article of the present invention undergoing formation.
Figure 7:
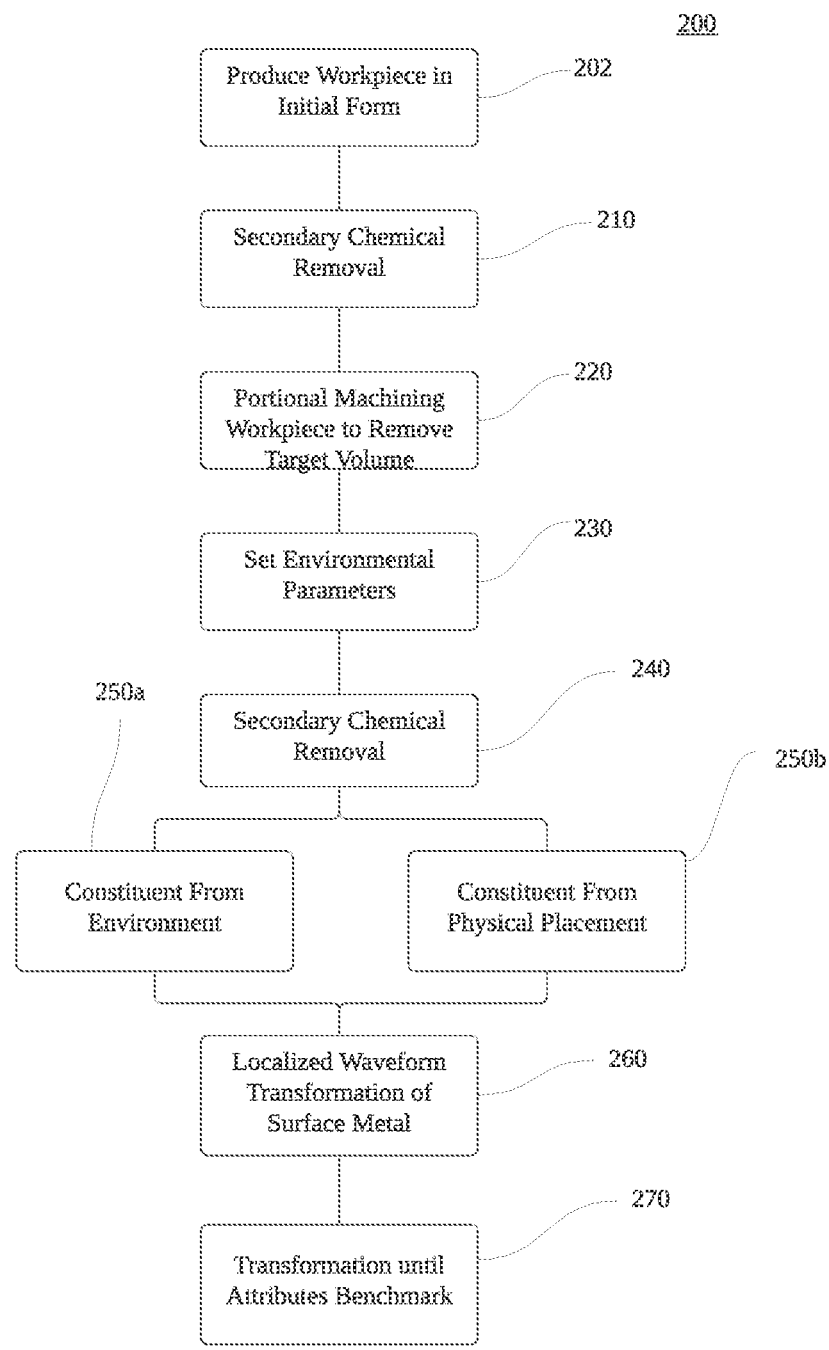
FIG. 7 is a view of the method of the present invention.
Figure 8:
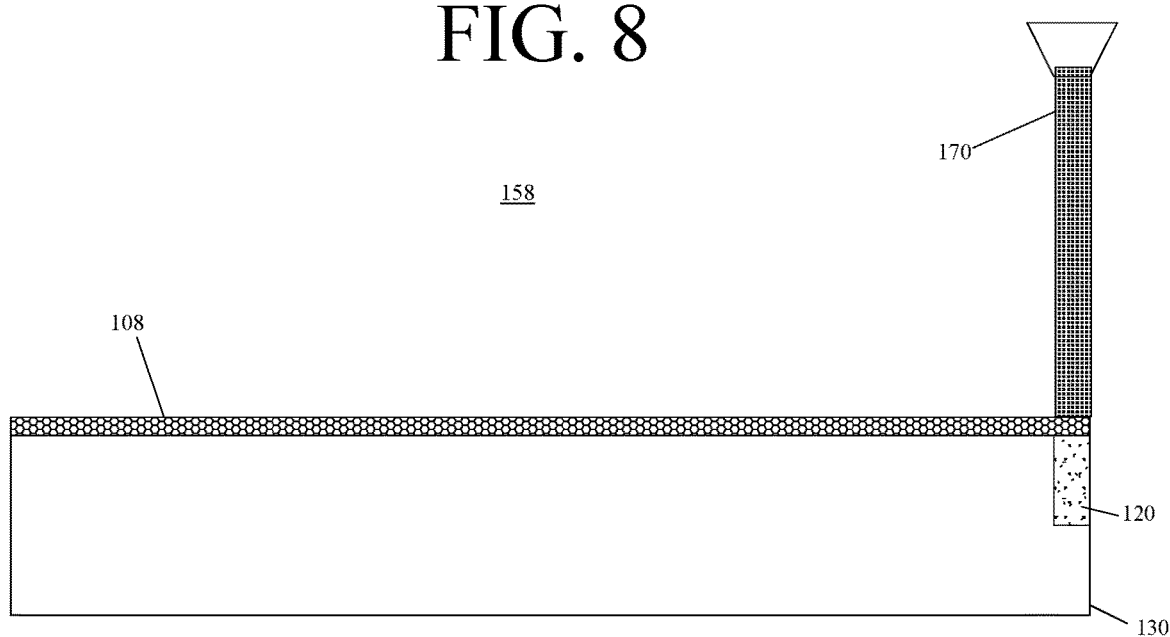
FIG. 8 is a view of an article of the present invention undergoing conversion.
Figure 9:
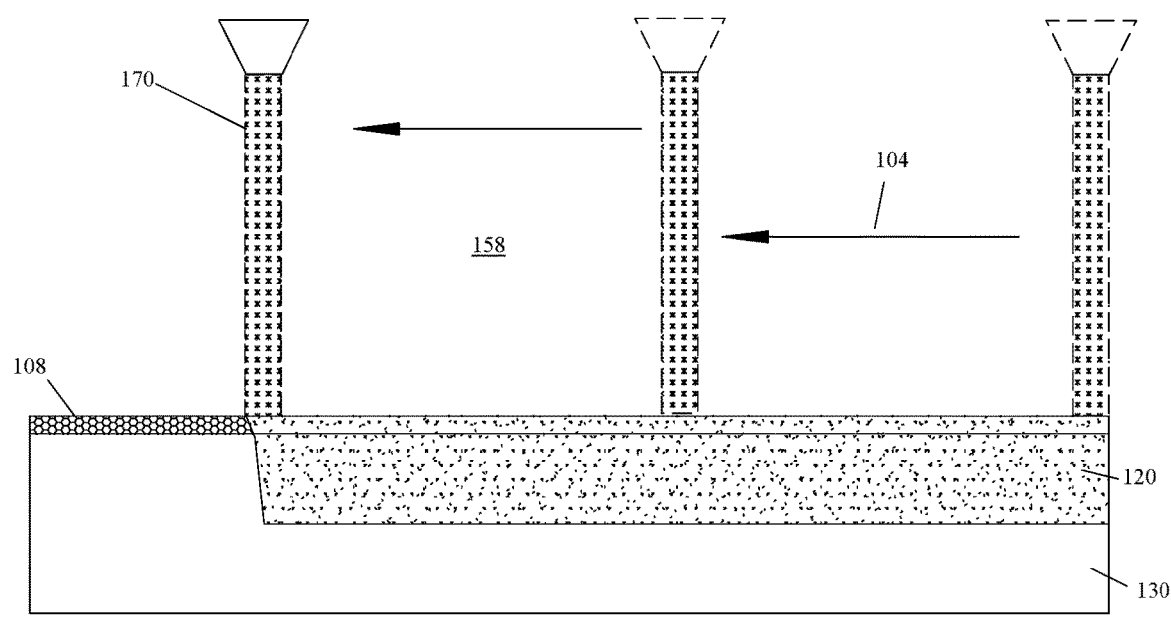
FIG. 9 is a view of an article of the present invention undergoing conversion.

Turning first to FIGS. 1, 2 and 7, the present invention includes the method 200 of unifying attributes of an article 100 that has undergone machining. The method 200 begins with the production 202 of the workpiece 100 in prefabricated form. A workpiece 100 of the present invention is a metal capable of being turned into a metal ceramic or a metal/ceramic combination. The scenario of FIGS. 1-2 illustrates an article of the second category comprising an ceramic outer layer 120 and an inner metal core layer 130. Ideal metals for use with the present invention include Titanium, Vanadium, Chromium, Mangan, Iron, Cobalt, Nickel, Copper, Zirconium, Niobium, Molybdenum, Hafnium, Tantalum, Wolfram, Rhenium, etc. Because the inventors work mostly with Titanium and its related ceramics, exemplary discussions herein may include Titanium, but generally the principles that apply to Titanium can be applied to the conversion of other metal ceramics. Ideal ceramics of the present invention can include Titanium Oxide, Titanium Diboride, Titanium Carbide, Titanium Nitride, etc. The present invention can be applied to generate a ceramic with the requisite hardness that can be applied to a vast quantity of industrial uses.

The initial workpiece includes a metal core 130 and a ceramic outer layer 120. One of the prevailing problems in the prior art is the machining of metal/ceramic workpieces and the resulting lack of uniformity in hardness and other attributes. Machining for purposes of the present invention can include any means by which volume is removed from a workpiece. Ideal forms of machining of the present invention include physical removal of material, such as with a blade; however, chemical removal and energy-based removal can be acceptable forms of machining. A workpiece article has a final form, whether it is the ultimate final form or merely the form finale from the step in a manufacturing process. There is an idea of the final shape of the workpiece that lacks the material targeted for removal, here the "target volume." The target volume 140 of the workpiece is designated for removal 220. The machining instrument 110 removes the target volume generating a surface of discontinuous ceramic depth relative to the whole. Workpiece articles received for machining tend to have relatively uniform depths and thicknesses of a ceramic layer (as shown in FIG. 1), and the removal of a target volume 140 results in a material of variable characteristics. For example, the material of the far left (of FIG. 2) can likely withstand significantly greater stress than those portions on the far right.

Figure 3:
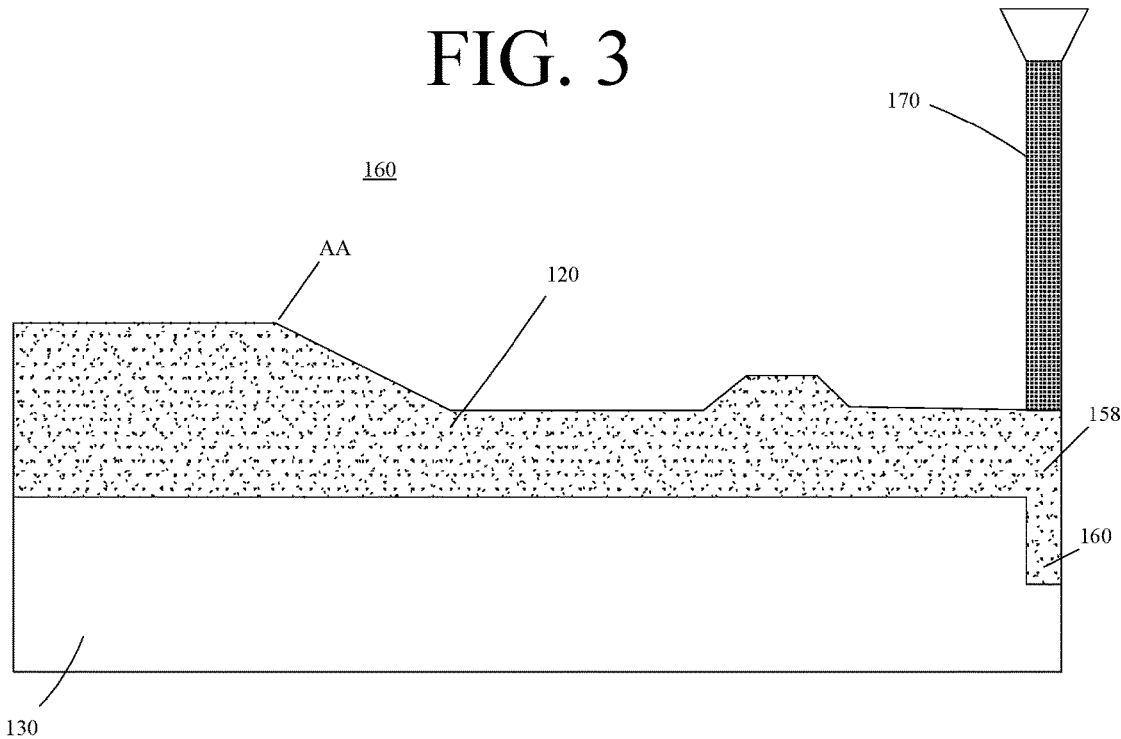
FIG. 3 is a view of an article of the present invention undergoing postformation conversion.
Figure 4:
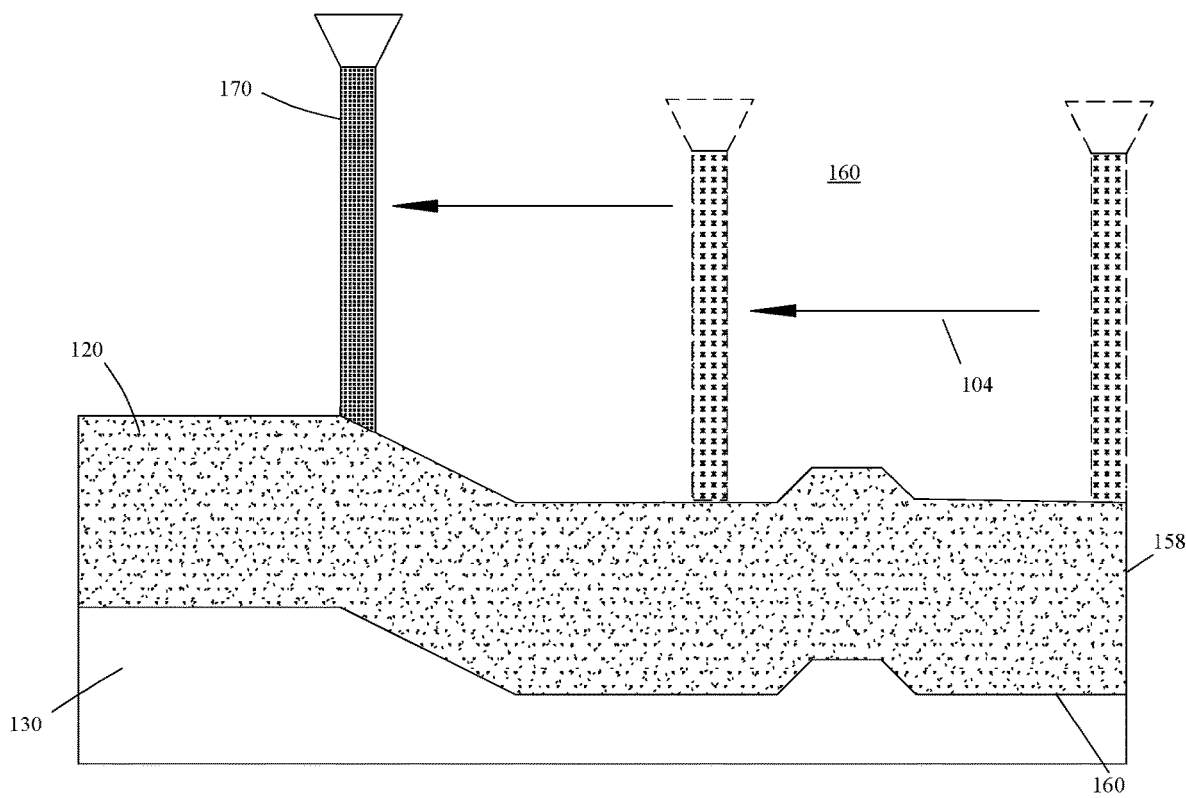
FIG. 4 is a view of an article of the present invention undergoing postformation conversion.

Turning to FIG. 3, the present invention utilizes waveform energy 170 to create localized conversion in a reaction zone of the metal to a metal oxide. The prior art has utilized a global conversion process with the understanding that applying energy to the whole article will likely affect the areas of less ceramic more than those of original ceramic depth. The present invention, however, applies waveform energy 170 to localized areas of the article 100 in order to control the degree of conversion. As shown in FIG. 3, a laser or other wave-based energy instrument (e.g., an arc lamp or UV transmission device) provides the energy available for conversion at the surface. Additional sources of wave energy suitable for the present invention include microwaves (e.g., from a cavity magnetron) and induction heating from a resistance source. Accordingly, the present invention avoids the prior art techniques of applying a new, discrete layer, and rather alters the chemical bonding of the metal to that of the ceramic in the energy rich bounds of the waveform energy. The conversion can therefore be highly controlled and repeatable. The present invention includes the concepts of a pre-formed ceramic 158 and a post-formed ceramic 160. A post-formed ceramic of the present invention is a ceramic that is created or modified subsequent to the machining of an article, something which is hardly done, if at all, in the prior art due to the complexity of the process.

The areas occupied originally by the ceramic, i.e., the preformed ceramic 158, remain relatively unaltered (although in instances wherein a shoddy article was supplied, the ceramic could be strengthened) while the post-formed ceramic 160 is generated by the application of the waveform energy 170 across the workpiece 100. The metal core 130 is meant to be a pure metal, alloy, or molecule. By "pure" for purposes of the present invention, it is meant that the metal lacks a ceramic of the metal. The present invention ideally works with articles that are a combination of a pure metal core with a ceramic (of that metal) exterior. Ceramics, although possessing attributes of phenomenal hardness, tend to be brittle; therefore articles comprising a substantially pure metal core with a ceramic coating can result in an article with the best of both attributes. The hardness of the ceramic is exterior facing and protects the pure core, while the durability of the core guards against the deficiencies inherent in ceramics, e.g. providing a buttress against sheer, bend, torsion, and impact forces. Because the present invention avoids discrete layering, i.e., arrangements wherein there is a significant change in composition from layer-to-layer, there is little danger of physical dissociation between layers resulting in exposure of the core.

Prior methods of treatment include the use of tools to substantially alter the atmosphere in which ceramic creation takes place. For example, ceramic creation can occur with an isostatic press to alter the temperature and pressure of the atmosphere surrounding the workpiece. In such manufacturing, a workpiece comprising at least one titanium alloy, such as Grade 2, Grade 5 or Grade 9, is been placed in a hot isostatic press. The workpiece is surrounded by a nitrogen containing gas inside a chamber of the hot isostatic press. It is possible also to use other nitrogen-containing gases such as ammonium gas. During an initial phase of the treatment, the pressure of the gas is increased, typically to a range between 100 and 200 MPa. The increase of the gas pressure may take place before, simultaneously with or after increasing the temperature in the gas Normally, the increase of the pressure and the temperature of the gas take place at least partly simultaneously.

The workpiece can be heated to an initial nitriding temperature ($T_{n1}$). The workpiece is thereafter subjected to this nitriding temperature $T_{n1}$ for a first predetermined time. The temperature may during the nitriding step be increased or decreased to any further nitriding temperature $T_{n2}$ and kept at this temperature for any second predetermined time. The nitriding step may thus comprise subjecting the workpieces to any number of different nitriding temperatures for any respective desirable times. During the nitriding step, the titanium alloy surface layer is converted to titanium nitrides. Typically TiN is formed in the outermost layer and Ti2N is formed further in from the outer surface. Additionally, nitrogen is diffused further into the titanium metal layer beneath the ceramic nitrides. In this metal layer portion the nitrogen content typically varies such that the nitrogen content is higher adjacent the nitrides and gradually decreases with increased material depth from the surface. That is to say that the nitriding step results in the formation of a ceramic nitride layer portion and nitrogen gradient layer portion in the titanium metal.

The initial nitriding temperature $T_{n1}$ lies above the β transus temperature of the titanium alloy in question. However, if nitriding is taking place at a nitriding temperature below the β transus temperature, it may be advantageous that the workpiece is heated above the β transus temperature to form the β structure of the titanium alloy in question, before quenching the workpiece. In further steps the workpiece is rapidly cooled during the quenching step of the method. During the quenching step the temperature of the workpiece is decreased from an initial quenching temperature $T_{q1}$ to a final quenching temperature $T_{q2}$. Normally, the initial quenching temperature $T_{q2}$ is equal to the last nitriding temperature. The quenching may be carried out under an essentially constant cooling rate throughout the quenching step. However, it may be advantageous to vary the cooling rate such that the temperature decrease per second is different during the passages of different temperature intervals during the quenching process.

By this means it is possible to control the grain size and formation of different phase structures of the titanium alloy.

It should be noted that the quenching process primarily influences the properties of the titanium metal including the nitrogen gradient layer portion below the nitride layers in the work piece. By this means the quenching step of the method may be favourably used for controlling the material properties of the entire workpiece. The quenching step is carried out under hot isostatic pressing conditions. The high isostatic pressures prevailing in the chamber greatly contributes to an enhanced heat transfer between the surrounding gas and the workpiece. By this means, not only is it possible to achieve very high actual cooling rates of the material in the workpiece but it also allows for that the actual cooling rates of the material in the workpiece is accurately and precisely controlled throughout the quenching process. The efficiency of the quenching process may be further enhanced by introducing heat exchangers, fans and other heat transfer enhancing means in the chamber. Where the nitriding has taken place above the β transus temperature and the titanium alloy of the workpiece has been fully transformed to the β structure, it is quenched at a quenching rate of 150 K/min or higher under maintained HIP conditions.

The quenching step can be followed by an aging step. At this step the workpiece is held at and aging temperature for a predetermined time. The aging temperature is preferably equal to the final quenching temperature Tq2. However, it is also possible that the aging of the material of the workpiece is carried out at any other suitable temperature. Further, in the shown example, the aging step is carried out immediately subsequent to finalizing the quenching and under high isostatic pressure in the chamber of the hot isostatic press.

At alternative embodiments of the invention, aging may be carried out at any pressure including atmospheric pressure inside or outside the hot isostatic press, e.g. in a conventional furnace. At some embodiments the aging step may even be fully dispensed with. The workpiece is cooled to room temperature. Just as with the aging step, cooling may take place under high pressure in the hot isostatic press or under lower, such as atmospheric, pressure in the same press. Alternatively, the cooling step may be carried out outside of the hot isostatic press. The workpiece may then be directly used in any application in which it is likely to be subjected to stress, strain, impact and/or wear under operation. Furthermore, the workpiece may be machined, either before the heating step a) or after the nitriding, quenching and aging is completed, for example, if some particular surface treatment is required.

Carrying out the heating and nitriding step under HIP conditions accelerates the heating rate, nitriding rate and deep diffusion of nitrogen into the bulk titanium alloy. Carrying out the quenching step under HIP conditions accelerates the cooling rate and concurrently reduces residual stresses due to superplastic conditions during a substantial part of the quenching process. Utilizing HIP conditions during any of the steps also results in the following advantages: elimination of casting porosity, elimination of residual stresses, consistent material properties and consistent machining properties.

The present invention need not apply any such high temperatures and pressure, and one of its features is that the present invention may be performed at conventional temperatures and pressures. By conventional temperatures and pressure, it is meant that the temperature and pressure do not have the magnitude to substantially alter the chemical properties of the metal. By conventional temperature, it is meant a range of STP +/−50%. In other words, from 137 degrees Kelvin to 409 degrees Kelvin, and 0.5 atm to 1.5 atm. When the present invention Rather than controlling the atmosphere surrounding the entire workpiece, energy is provided 260 locally via waveform energy 170, and for larger workpieces one portion of the workpiece may be subject to conventional temperature and pressure while the localized application of waveform energy may energize the localized area beyond conventional temperature and pressure.

Figure 5:
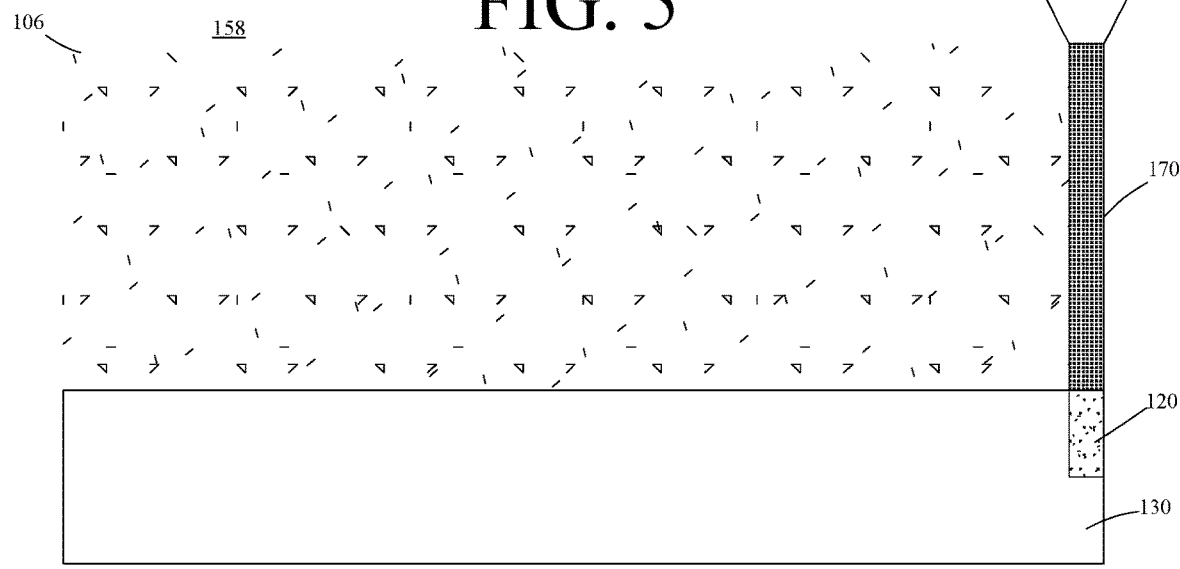
FIG. 5 is a view of an article of the present invention undergoing conversion.
Figure 6:
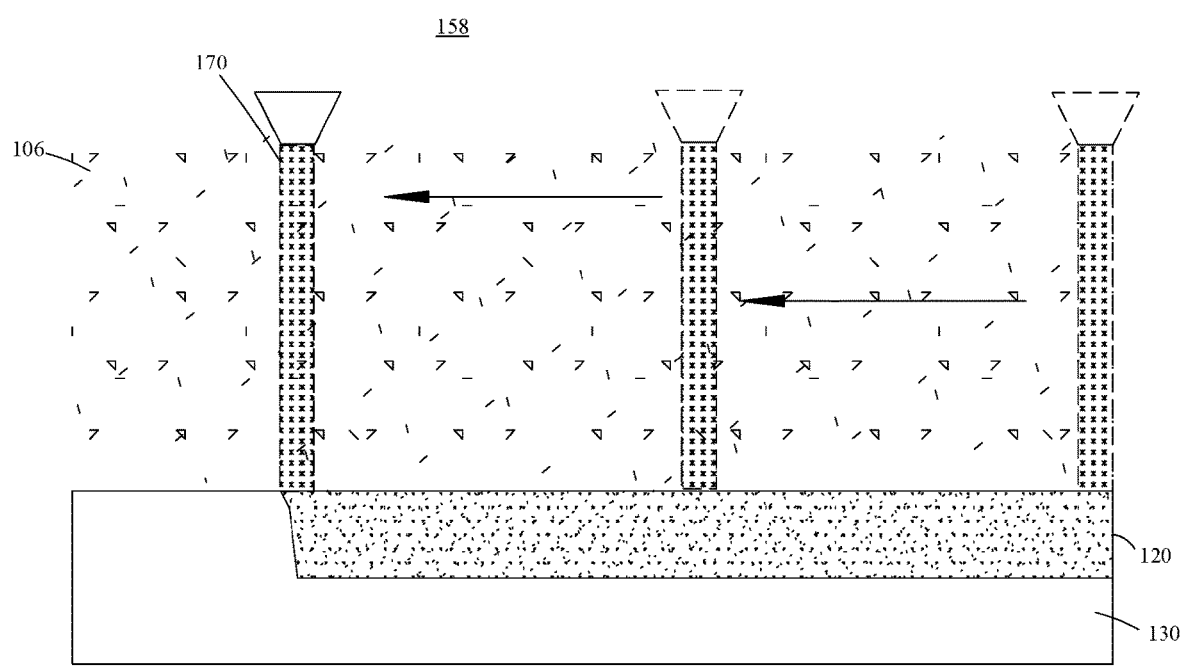
FIG. 6 is a view of an article of the present invention undergoing conversion.

As shown in FIGS. 5-7, 10-11, the waveform energy 170 provides purely localized ceramic conversion in a reaction zone. The reaction zone for a laser beam would include the cross-section surface area of the beam. The waveform energy 170 is motioned along the surface of the workpiece 100. The core of the non-ceramic, "pure," metal is exposed to the energy 170 and because there is either in the atmosphere, as in FIGS. 6-7, or provided adjacent to the surface, as in FIGS. 10-11, an atmospheric ceramic constituent 106 or a surface ceramic constituent 108, the conversion of the pure core only occurs upon contact with the energy 170. In FIGS. 5-6, the energy 170 is applied to a pure metal or alloy, which upon contact provides conversion to the outer ceramic layer 190. Because the waveform energy can be highly controlled, the hardness, depth, and other physical attributes of the workpiece can be finely controlled. The constituent 106 that provides the characteristics for the ceramic is available from the atmosphere. Examples of ceramic constituents that are best provided from the atmosphere surrounding the workpiece includes Methane, Nitrogen (gas), Butane, Oxygen (gas), Boron, Carbon, etc. It is preferred that the waveform energy is provided via a pulsed beam. Although laser energy from a macro view seems serene, on a micro view, the destruction applied via a laser beam can be quite violent and transformative to the surface details. Pulsed in the laser beam, or other waveform energy, can minimize destructive plume effects and result in a very ordered conversion. The present invention results in highly deterministic results that can be said to be truly isotropic.

Figure 10:
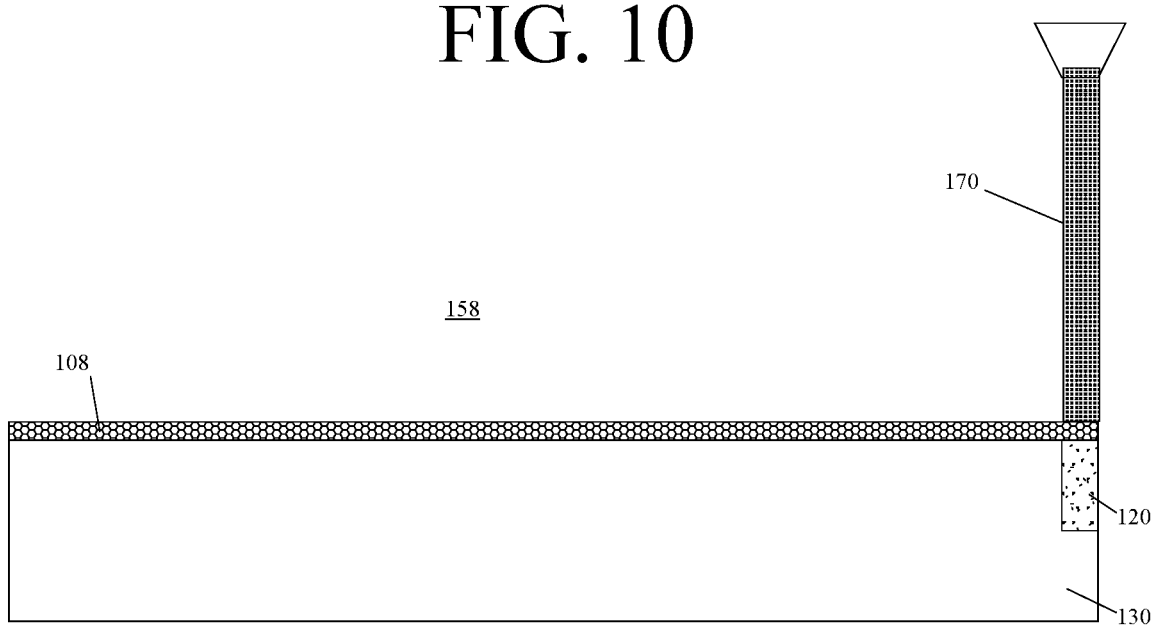
FIG. 10 is a view of an article of the present invention undergoing conversion.
Figure 11:
FIG. 11 is a view of an article of the present invention undergoing conversion.

In FIGS. 10-11, the energy 170 is applied to a pure metal or alloy, which upon contact provides conversion to the outer ceramic layer 190 in the reaction zone. The reaction zone for a laser beam would include the cross-section surface area of the beam. Because the waveform energy can be highly controlled, the hardness, depth, and other physical attributes of the workpiece can be finely controlled. The constituent 108 that provides the characteristics for the ceramic is available from the surface of the workpiece. Examples of ceramic constituents that are best provided near the surface include Boron Nitride, Carbon Nitride. These physically adjacent chemicals can be applied to a surface via sputtering or other known method of application. It is preferred that the waveform energy is provided via a pulsed beam. Although laser energy from a macro view seems serene, on a micro view, the destruction applied via a laser beam can be quite violent and transformative to the surface details. Pulsed in the laser beam, or other waveform energy, can minimize destructive plume effects and result in a very ordered conversion. The present invention results in highly deterministic results that can be said to be truly isotropic.

The ambient environment, whether or not a ceramic constituent is available therein, should be highly controlled to prevent the inclusion of impurities. For example, in a machine shop, the ambient air usually contains oil spray. This is not a suitable atmosphere to do the final preparations of the physical conversion process.

The preferred waveform energy 170 is provided via a pulsed laser. The intensity, wavelength, pulse rate, and other laser attributes utilized can include. The significance of directed energy is to be able penetrate the exterior of the surface materials in a controlled, confined area. A laser can punch down into the lower levels of the surface materials in a highly deterministic fashion. Preferred lasers of the present invention have been successful in implementing the process 100 at 355 nm to 1016 nm. 532 nm has been successfully used. Other, more exotic wavelengths could perhaps be used, although sub-157 nm wavelengths have not attempted with the present invention.

The pulsation of the directed energy is significant in that it has been found that extended exposure to the directed energy can be detrimental to the conversion of the metal to a ceramic. At prolonged exposure the outer surface receives too much energy and volume loss is encountered—and done so without retaining the ceramic change desired. If maintained ablation is utilized, the material under laser exposure would simply boil off the surface material and the exterior would undergo a phase shift from solid to gas. The upper surface would evaporate—including the metal. The present invention uses fairly short pulses, and these need on the scale of approximately nanoscale and smaller. The exposure time scale depends on the surface area of the material.

The dynamics of the beam geometry are controlled by the energy density utilized in the creation of the ceramic. Relatively standard laser dynamics are capable of being utilized; experimentally, a beam diameter of 30-40 um is utilized and the beam around a scrolling rate around 100 m/s. This scrolling or translation rate (i.e., the speed at which the beam across the material) can be varied to lengthen or minimize the exposure of the material to the beam. The quantity of passes is correlated to the energy density. The default value would be 50% overlap. In other words, the next pass would expose about half of the already processed surface area. This is a value that is usually applied on a case-by-case basis and affirmed experimentally. This is tied to the thickness of the substrate, and detailed experimentation has shown that more often than not, one 50% overlap pass is sufficient.

The power level of the level depends on the laser selected. Experimentally, use of a laser of around 500 W has shown good effect with an energy density around (for Ti) about 5 MW/mm sq. This would vary with wavelength. The energy density also affects the 'penetration effect' relative to the material (that is to say, the effects of the beam extend deeper into the surface).

The energy of the laser is distributed as evenly as possible throughout the laser to present spotting effects. Experimentally, great effect has been achieved by use of a fiber that creates a kaleidoscope effect that presents a more uniform distribution. This 'top hat' distribution results in a more uniform distribution within the beam itself.

Returning to FIGS. 1-4, and in particular FIG. 3, the present invention includes physical conversion of the outer surface 120 to be uniform. In the post-formed article of FIG. 3, the area surrounding point AA would be considered a weak spot of the post-formed article. This is because the areas farther to the left have a greater mass of ceramic relative to the areas to the right of point AA. Because the present invention utilizes wave energy 170 to act in a reaction zone, rather than universally (i.e., over the entire workpiece at all times), and for a controllable period of time, the process can result in an outer layer of ceramic that is uniform in depth. The reaction zone may be utilized only on those portions of the post-formed article 160 that are newly-exposed due to loss of machined volume. Accordingly, the present invention may be applied, not only to simply 'increase the durability' of the article, but rather to make the durability uniform. In many applications it is as important that the article is uniform as it is important that the article is durable.

The duration of wave energy emission upon the workpiece will depend upon the benchmark attributes sought by the user. The user can either apply the laser or wave energy until a particular degree of hardness, or other attribute, or a relational degree is reached. Attributes that may be considered include: elastic modulus, ductility, dimensional stability, wear resistance, resistance to corrosion and chemical attack, weather resistance, melting point, working temperature, thermal expansion, thermal conductivity, electrical insulation, tensile strength, compressive strength, machinability, opacity, brittleness, impact strength, thermal shock resistance, electrical conductivity, resistivity, chemical resistance etc. Of greater significance is the relative relationship between the machined portions of the post-formed workpiece compared to the original portion of the post-formed workpiece. For machinery, this is probably best determined experimentally rather than theoretically. As part of the present invention, a user may consider attempting to mathematically determine a duration, intensity, pulse rate, etc. of the application of wave energy to ensure that the attributes of the original surface are comparable to the machined surface. Alternatively, a user may consider making multiple versions of the article at different waveform attributes and durations to result in an article of substantially uniform characteristics.

The durations of the application of the waveform energy of the present invention will be dependent on the attributes and/or uniformity desired. Generally, diminishing returns begins to apply around twenty four hours and the process need not be continued beyond this duration.

The articles of the present invention can be, for example, engine parts such as wrist pins, hydraulic suspension parts, ball bearings, orthopedic implants, surgical materials, boat propellers, etc.

An additional, preferred article includes components for electrochemical cells. Turning now to FIGS. 12-16, electrochemical cells offer a great potential for efficient and environmentally friendly generation of energy. A fuel cell consists of a membrane electrode assembly (MEA) comprising an anode and a cathode separated by a membrane permeable to electrolytes, and two separating plates, frequently referred to as bipolar plates. Individual cells are then connected in series, forming a fuel cell stack, frequently referred to only as a stack. Increasing the number of cells in a stack increases the voltage, while increasing the surface area of the cells increases the current. In a fuel cell stack, the separators or bipolar plates have many functions.

They connect and separate the individual fuel cells in series to form a stack with required voltage, support uniform distribution of fuel gas and oxygen over the whole active surface area of the membrane-electrode assemblies, conduct electrical current from the anode of one cell to the cathode of the next, facilitate water management within the cell, support the thin electrolyte membrane and electrodes and give structure and mechanical strength to the stack assembly, among other things. Consequently, there are high demands on the properties of a separator/bipolar plate to fulfill the many functions. A bipolar plate is for example required to be electrically conducting, resistant to corrosion and fouling, and to exhibit sufficient mechanical strength.

According to a first aspect, the present disclosure makes available a method for producing a shaped article comprising a base material having an anodic side and a cathodic side, wherein a metal surface layer is incorporated in or arranged on said base material and whereupon said surface layer is nitrided, and wherein the nitriding is performed under hot isostatic pressing conditions. According to an embodiment of said first aspect, the base material is chosen from stainless steel, aluminum, titanium, zirconium and nickel. In one embodiment the base material is stainless steel, preferably SS 316. The substrate is preferably formed from a steel material or has been formed from a steel material. In particular, it is formed or to has been formed from a steel sheet. In one embodiment the substrate or base material is formed or has been formed from a stainless steel material, in particular a stainless steel sheet. According to another embodiment, the base material is aluminum. According to an embodiment of the first aspect of the electrochemical cell, freely combinable with the above embodiments, the metal surface layer is chosen from niobium, titanium and zirconium.

A particularly impervious layer, in particular titanium layer, can, in particular, be obtainable when this is applied in a plasma spraying process, using a powder feed rate of, for example, about 11.66 g/min. A plasma enthalpy is preferably about 21.27 MJkg-i. The pressure prevailing in the region of the in particular plate shaped substrate during production of the layer is preferably about 50 mbar. The layer is preferably produced in a multilayer process, i.e. the total layer to be produced is produced by application of a plurality of preferably very thin layers. The powder used for producing the layer preferably has a particle size of at least about 45 pm. In the case of a layer configured as a titanium layer, the proportion by mass of titanium in the total bipolar plate is preferably not more than about 5% by mass, in particular not more than about 3% by mass, in particular with a total thickness of the bipolar plate of about 1 mm.

According to an embodiment, the base material is nitrided on one or both sides before the application of the metal surface layer. This has the advantage of both strengthening and protecting the base material, and also preventing diffusion of material between the base material and the metal surface layers when these are joined, for example in a HIP.

According to yet another embodiment, freely combinable with the above embodiments, a layer of carbon is deposited on the nitrided metal surface layer on the cathodic side. This carbon layer is chosen from diamond and/or graphitic carbon, for example impermeable layers of graphite or graphene. Preferably the layer is self-healing, in particular in order to optimize the electrical properties. In particular, this makes it possible preferably to prevent iron ions from a steel base plate or substrate contributing to poisoning of the electrochemical cell. Preferably the carbon layer is diamond-like carbon.

According to a particular embodiment of said first aspect, freely combinable with the above embodiments, said shaped article is manufactured by an additive manufacturing method and thereafter subjected to hot isostatic pressing conditions for pore closing and diffusion bonding of the materials forming said shape article. Said additive manufacturing method is preferably chosen from powder bed laser sintering, powder feed laser sintering, wire feed additive manufacturing and cold spray 3D printing. According to another embodiment of said first aspect, freely combinable with the above embodiments, said shaped article is manufactured by a method chosen from cold-rolling, die-cutting and press forming, electromagnetic forming (magneforming), magnetic pulse welding, hydro forming, superplastic forming, and high-speed forming or a combination thereof.

According to yet another embodiment of said first aspect, also freely combinable with the above embodiments, said shaped article is manufactured by subtractive laser machining. In this embodiment of the method, said laser machining is used to for example to cut, weld, wash, polish, anneal, harden, nitride and/or coat the metal surfaces, or to perform combination of these operations sequentially or in parallel.

As illustrated in FIGS. 12-15, it can be advantageous for the shaped article to be provided with a plurality of flow channels on one side or both sides. Depending on the manufacturing method chosen, these channels are formed before or after application of the metal surface layer.

The channels are preferably provided when manufacturing the shaped article using an additive manufacturing method, but can also be provided using a subtractive method, such as traditional machining, for example by milling and/or forming, preferably performed before the layer is applied. It is contemplated that the surface of the shaped article is roughened, in particular in a sandblasting process and/or in a grinding process, before the metal surface layer is applied. The layer is preferably applied to the surface of the substrate on one side, so that, for example, all the contact surfaces via which the bipolar plates are possible to place in contact with further components for electrical contacting, and/or the surfaces of the flow channels, are coated.

There are many different methods available for applying the metal surface layer. In one embodiment, a powdered material, for example titanium powder is melted by means of plasma and applied to the substrate under reduced pressure. In this way, a layer having a high density and good electrical contact with the substrate can be formed. It can be advantageous if the surface on one side, or both, additionally is provided with a thin contacting layer in order to optimize electrical contacting. This is particularly advantageous when the shaped article is a bipolar plate for an electrochemical cell. For this purpose, the present disclosure makes available a bipolar plate for an electrochemical cell, which is both mechanically and chemically stable and is possible to produce effectively and yet inexpensively.

According to a particular embodiment of said first aspect, freely combinable with the above embodiments, the metal surface layer is arranged by chemical vapor deposition, plasma-enhanced chemical vapor deposition, cold spraying, thermal spraying, hot dipping, electro plating, electroless plating, or rolling.

Figure 16:
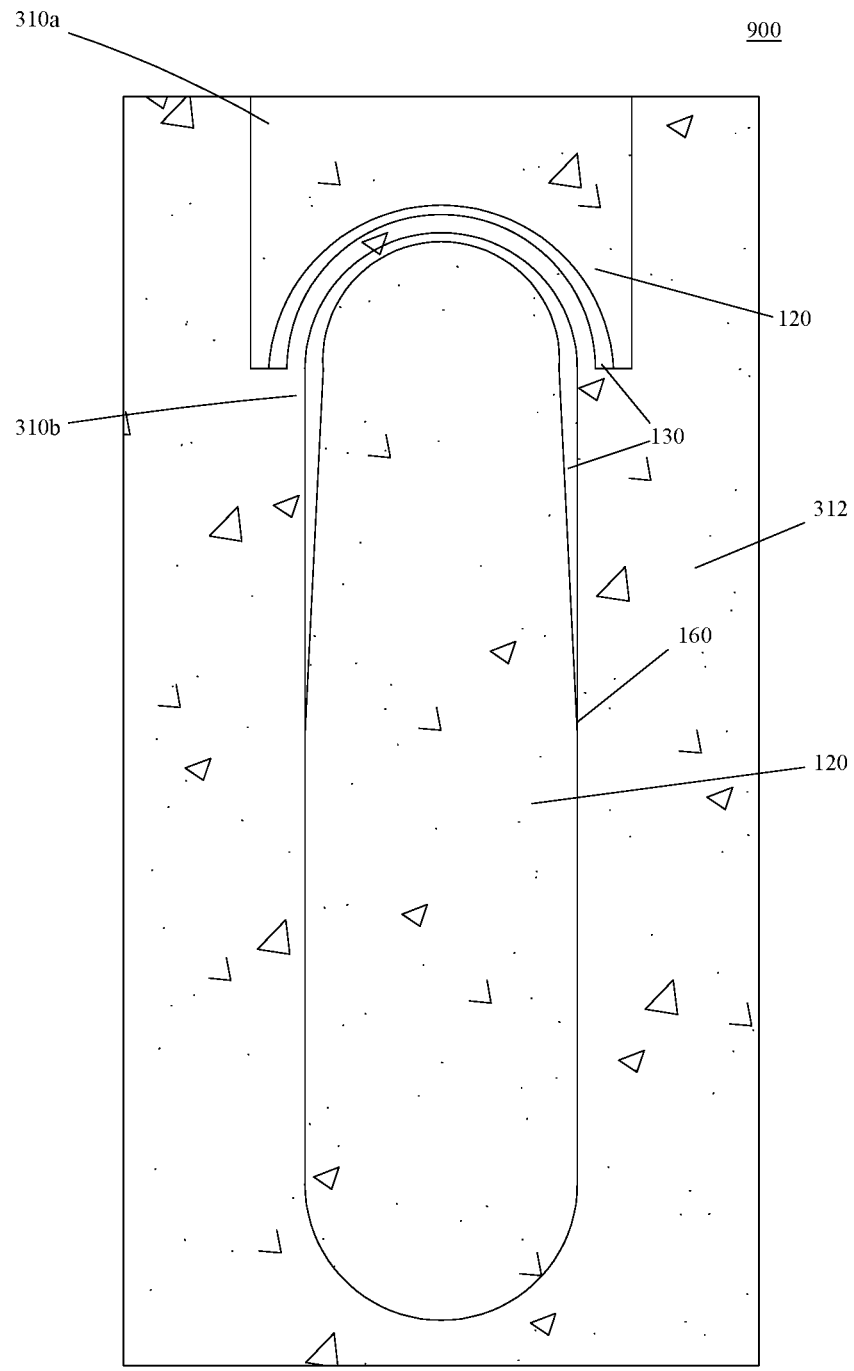
FIG. 16 is a view of an orthopedic article of the present invention utilized in an in vivo environment.

Preferably the base material is nitrided prior to the application of the metal surface layer. This is schematically illustrated in FIG. 16, where (A) shows a cross section of a plate having a base material comprising or substantially consisting of stainless steel, for example a steel sheet (I). On each sides of the steel sheet, thin metal surface layers (II) have been applied, for example titanium layers. However, before applying the titanium layer, the steel sheet was nitrided, here illustrated as the layer (III) on both sides of the steel sheet (I). Finally, the titanium layers (II) have been nitrided, forming titanium nitride layers (III).

In FIG. 16 (B) an alternative embodiment is shown, where a metal surface layers (II) have been applied directly on a substrate or base, for example an aluminum sheet (IV). Finally, the titanium layers (II) have been nitrided, forming titanium nitride layers (III). It should be noted that both FIGS. 15 (A) and (B) are schematic only, and not drawn to scale. A second aspect of the present disclosure relates to a bipolar plate manufactured by a method according to the above first aspect, and any one of the embodiments thereof.

A third aspect of the present disclosure relates to a method for producing a shaped article comprising a base material consisting substantially of a polymer, and having an anodic side and a cathodic side, wherein a metal surface layer is arranged on said base material and whereupon said surface layer is nitrided, wherein said metal surface layer is chosen from niobium, titanium, and zirconium, and said nitriding is performed using laser.

According to an embodiment of said third aspect, a layer of carbon is deposited on the nitrided metal surface layer on the cathodic side of said shaped article. This carbon layer is chosen from diamond and/or graphitic carbon, for example impermeable layers of graphite or graphene. Preferably the layer is self-healing, in particular in order to optimize the electrical properties. In particular, this makes it possible preferably to prevent iron ions from a steel base plate or substrate contributing to poisoning of the electrochemical cell. Preferably the carbon layer is diamond-like carbon.

According to a particular embodiment of said third aspect, freely combinable with the above embodiments, said shaped article is manufactured by an additive manufacturing method and thereafter subjected to hot isostatic pressing conditions for pore closing and diffusion bonding of the materials forming said shape article. Said additive manufacturing method is preferably chosen from powder bed laser sintering, powder feed laser sintering, wire feed additive manufacturing and cold spray 3D printing.

According to another embodiment of said third aspect, freely combinable with the above embodiments, said shaped article is manufactured by a method chosen from col-rolling, die-cutting and press forming, electromagnetic forming (magneforming), magnetic pulse welding, hydro forming, superplastic forming, and high-speed forming or a combination thereof.

According to yet another embodiment of said third aspect, also freely combinable with the above embodiments, said shaped article is manufactured by subtractive laser machining. In this embodiment of the method, said laser machining is used to for example to cut, weld, wash, polish, anneal, harden, nitride and/or coat the metal surfaces, or to perform combination of these operations sequentially or in parallel.

According to a particular embodiment of said third aspect, freely combinable with the above embodiments, the metal surface layer is arranged by chemical vapour deposition, plasma-enhanced chemical vapor deposition, cold spraying, thermal spraying, hot dipping, electro plating, electroless plating, or rolling. The method according to any one of the claims 13-16, wherein said shaped article is a bipolar plate or separator for use in a fuel cell and/or fuel cell stack.

A fourth aspect of the present disclosure relates to a bipolar plate manufactured by a method according to the above third aspect, and any one of the embodiments thereof.

A fifth aspect of the present disclosure relates to an electrochemical cell or fuel cell comprising a bipolar plate according the second or fourth aspects above. The electrochemical cell is configured as an electrolysis cell or as a fuel cell. Preferably the entire surface of the substrate which comes into contact with operating fluids of the electrochemical cell during operation of the electrochemical cell is provided with the metal surface layer and optionally also a conductive layer.

Figure 12:
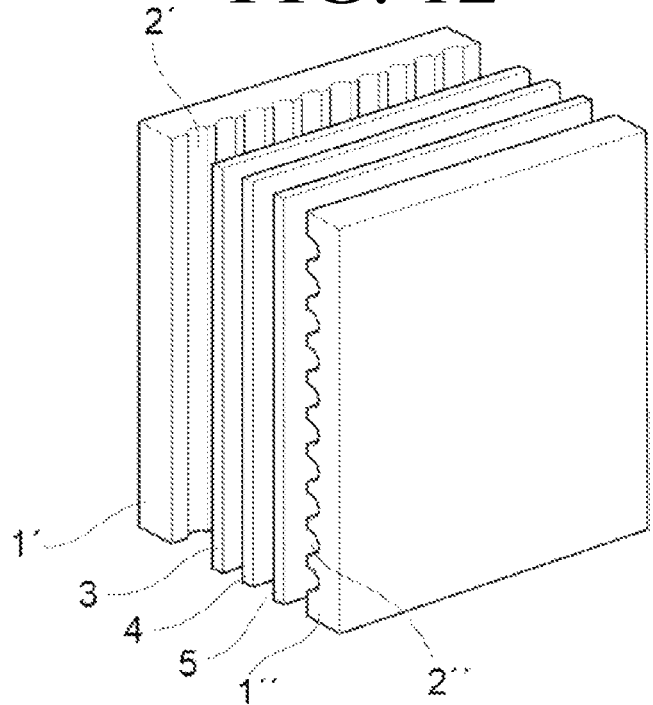
FIG. 12 is a view of an article of the present invention utilized in an electrochemical cell.

An example of an electrochemical cell, or fuel cell, is shown in FIG. 12 where a central portion is schematically shown. Here, two bipolar plates 1' and 1" are arranged opposing each other, and enclosing an anode 3, an electrolyte membrane 4 and a cathode 5. As indicated in the figure, the bipolar plates 1' and 1" have a pattern of channels 2' and 2" for allowing the flow of gases and liquids and distributing these evenly over the anode and cathode surfaces, respectively.

In an electrochemical cell, the bipolar plates need to comprise one or more electrically conductive materials. Further, they preferably comprise flow channels, shown as 2' and 2" in FIG. 12 by means of which operating fluids used in operation of the electrochemical device, in particular operating gases, such as for example hydrogen can be uniformly distributed, introduced and/or discharged within each electrochemical cell.

Figure 13:
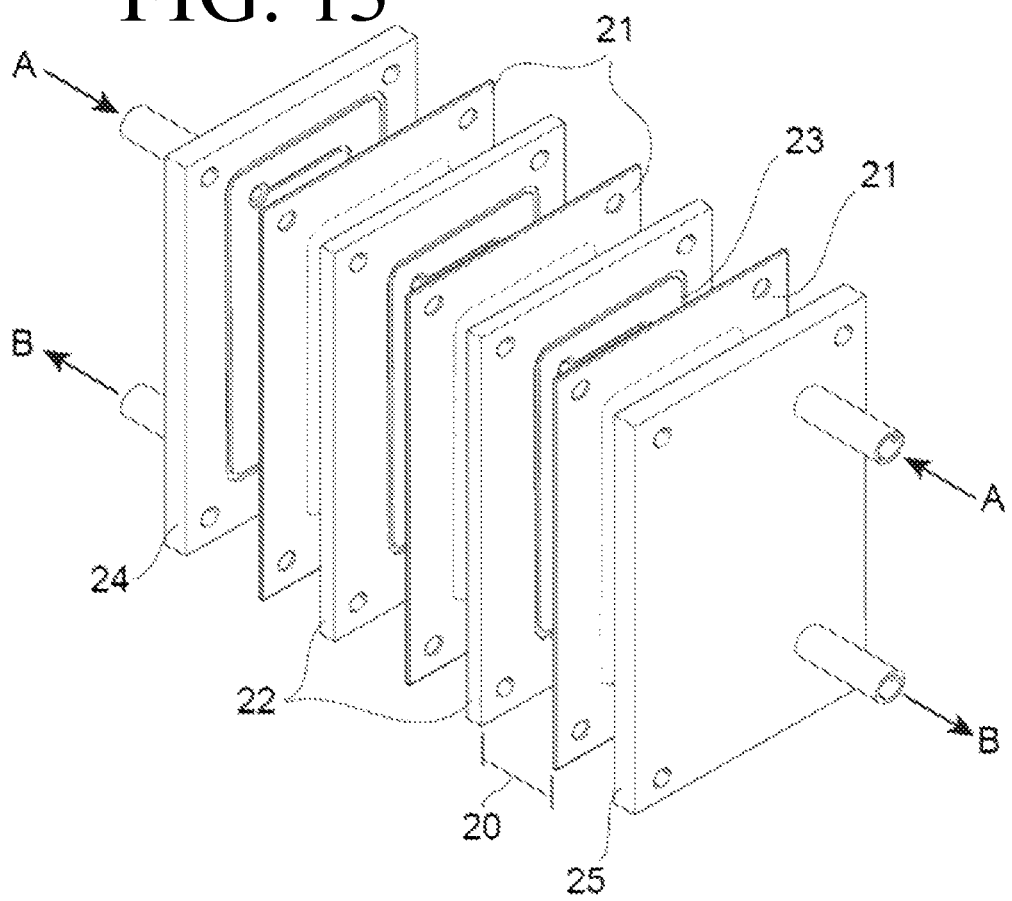
FIG. 13 is a view of an article of the present invention utilized in an electrochemical cell.

FIG. 13 shows a schematic exploded view of a fuel stack having endplates 24 and 25, enclosing between them a number of membrane electrode assemblies (MEA) 21 separated by bipolar plates 22. One bipolar plate and one membrane electrode assembly together form a repeat unit 20. At the end plates, inlets A are provided for the fuel, e.g. hydrogen, and outlets B provided for the by-products, e.g. water.

Figure 14:
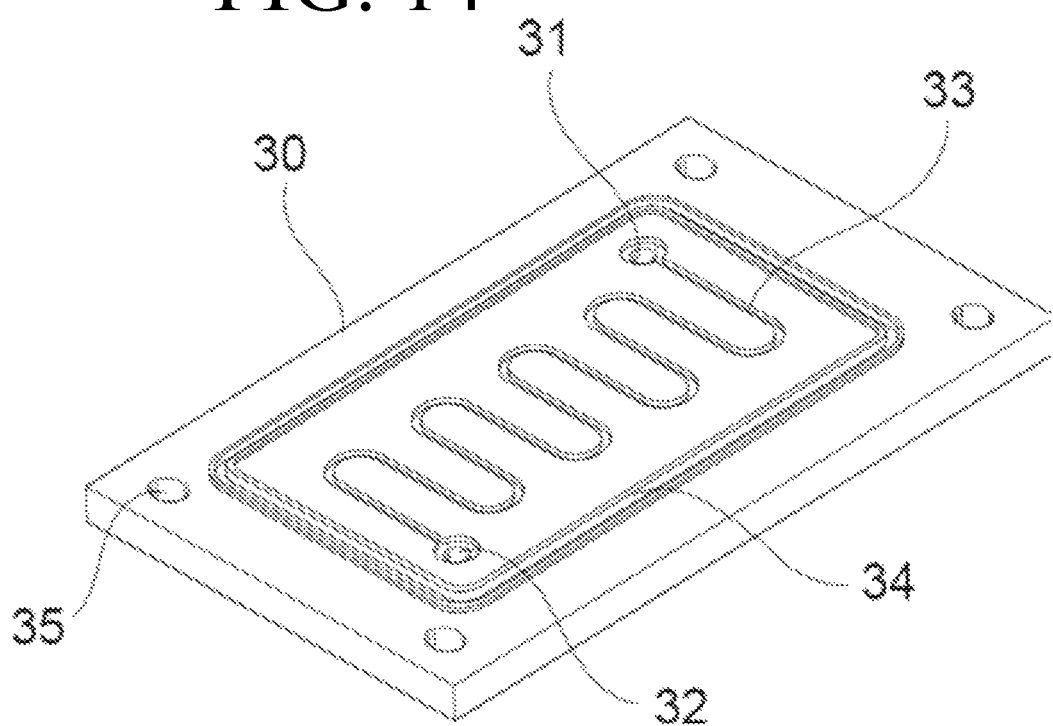
FIG. 14 is a view of an article of the present invention utilized in an electrochemical cell.

FIG. 14 shows a perspective view of a surface of a bipolar plate 30, illustrating how it can have an inlet 31 and an outlet 32, connected by a flow channel 33 having a serpentine design, maximizing gas and liquid contact over the MEA. Further, said plate 30 preferably has a structural element aiding in creating a tight seal between the MEA and the plate, here illustrated as a groove 34. A seal (not shown) can be provided in said groove. Holes 35 are also shown, through which bolts (not shown) can be inserted. The bolts extend through all repeat units and through the end plates, where nuts are tightened to hold the fuel stack together.

Figure 15:
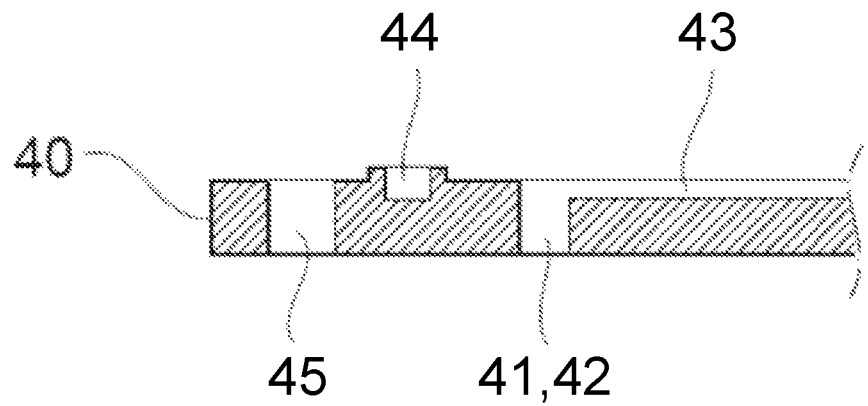
FIG. 15 is a view of an article of the present invention utilized in an electrochemical cell.

FIG. 15 shows a cross section of a bipolar plate 40, corresponding to the plates 1', 1", 22, and 30 in the previous figures. In the cross section, an inlet/outlet 41/42, a section of a channel 43, as well the structural element 44 are shown. The inlet/outlet 41/42 corresponds to the inlet and outlet 31 and 32 in the previous figure. Similarly, the channel 43 corresponds to channel 33 in the previous figure and channels 2' and 2" in FIG. 12. Also a hole 45 for receiving a bolt (not shown) is indicated in the figure, corresponding to the hole 35 in FIG. 15. It is conceived that the bipolar plate has a pattern of channels and structural elements also on the opposite side, but this is however not shown in this figure. Such pattern may be identical or different, and is preferably displaced, for example rotated 90 degrees in relation to the pattern on the opposite side in order to distribute the flow of gas and liquid evenly over the surface of the MEA. This is indicated in FIG. 1, where channels 2' and 2" are shown as oriented perpendicular to each other.

Different channel configurations are available, and well known to a person skilled in the art. The channels may be laid out in a serpentine or zig-zag pattern, facilitating an even flow of liquids or gas, and ensuring an even distribution over the membrane. The metal surface layer, in addition to providing corrosion resistance, may also aid in reducing friction and improve the flow and counteract fouling in the channels, which constitutes an additional advantage of the aspects and embodiments herein. The herein disclosed method and the resulting plates have many advantages, contributing to reduced cost of the fuel cell stack, and at the same time making it possible to reduce the weight with maintained or even improved strength and durability. Consequently the plates can be made very thin and at the same time rigid and durable. With reduced material thickness and weight, larger fuel cell areas can be obtained, allowing for a higher output current, or if the number of cells is increased, a higher voltage.

It becomes possible to produce the plates from a substrate of one material, provided with a layer of another material, wherein the material of the substrate can be an inexpensive substrate which is then functionalized and protected by means of said layer during operation of the electrochemical cell.

Further, the method disclosed herein makes it possible to avoid the use of chromium but still achieve a hard and corrosion resistant surface. The release of toxic chromium species from stainless steels during operation of fuel cells is otherwise a serious problem associated with the use of stainless steel bipolar plates.

Further, the method disclosed herein also allows a reduction of the thickness of the coating, reducing the amount of precious metals (titanium, zirconium etc) needed to create the necessary corrosion resistance.

Additionally, the sequence of the method steps, wherein the coating is applied to an already machined separator plate, makes sure that the integrity of the coating is not compromised.

Further embodiments, and the advantages associated therewith, will become evident from the description and claims, as well as the following examples.

EXAMPLES

Example 1. Die-Cut Steel Plate

A plate of stainless steel, size approximately 10×15 cm (4×6 inches) is die cut and holes punched in the corners. The plate is carefully washed to remove grease and dirt, whereupon the surface is cleaned and micro-roughened using laser, for example using a 20 W fiber laser. The laser is also used to deburr the holes and smoothen the edges of the plate. The laser parameters such as scan rate, laser pulse frequency and intensity are adjusted to achieved the desired result.

A thin layer of titanium is deposited on the plate by the PVD method in a vacuum chamber. The titanium layer is then nitrided under hot isostatic pressing conditions in a nitrogen-enriched atmosphere, resulting in a layer of titanium nitride and a hardening of the steel plate, evidenced as increased surface hardness and mechanical strength. The plate is bent in different angles, and the result inspected and photographed using a scanning electron microscope. The quality of the nitrided surface is shown in that the surface layer is fully integrated with the bulk metal and does not show signs of separating even after repeated bending.

The treatment is repeated in an atmosphere containing a hydrocarbon gas, resulting in the formation of a titanium carbide layer. The presence of the carbide layer is easily detected as a darkened surface, and the plate feels very smooth to touch. Microscope inspection and hardness testing confirms the observations.

Example 2. Laser Machined Steel Plate

A plate of stainless steel, size approximately 10×15 cm (4×6 inches) is prepared by laser machining, for example using a 20 W fiber laser, and provided with four holes at the corners, and a pattern simulating the flow channels necessary in a bipolar plate. The steel surface is cleaned and polished using the same laser, at a different setting.

A thin layer of titanium is deposited on the steel plate by the CVD method in a vacuum chamber. The titanium layer is then nitrided under hot isostatic pressing conditions in a nitrogen-enriched atmosphere, resulting in a layer of titanium nitride and a hardening of the steel plate, evidenced as increased surface hardness and mechanical strength. The plate is bent in different angles, and the result inspected and photographed using a scanning electron microscope.

The treatment is repeated in an atmosphere containing a hydrocarbon gas, resulting in the formation of a titanium carbide layer. Again, the presence of the carbide layer is easily detected as a darkened surface, and the plate feels very smooth to touch. Microscope inspection and hardness testing confirms the observations.

Example 3. Additive Manufacturing of a Separator Plate

A separator plate with a shape and with features approximately as shown in FIG. 14 is manufactured using additive manufacturing, for example using the so called cold spray technology, in which a metal powder is accelerated in a gas jet and applied to a surface at velocities so high, that the metal undergoes plastic deformation and adheres to the surface. For example titanium can be applied to a steel or aluminum plate.

As a first step, a CAD-drawing of a separator plate with a simplified geometry is prepared. The plate has a single serpentine flow path, holes for supply and removal of media, and holes in the corners for the bolts used to compress the stack. Based on this CAD-drawing, the experimental plate is then prepared using a combination of traditional subtractive machining and additive manufacturing, such as cold spray.

The resulting plate with a titanium surface is nitrided under hot isostatic processing conditions (HIP) in a laboratory HIP system. The HIP treatment additionally stabilizes and homogenizes the material.

It is conceived that the core of the plate is made of steel or aluminium, and given an outer layer of titanium or zirconium, but it is also possible that the plate is entirely made of for example titanium or zirconium.

The present invention results in a process with increased efficacy (in time and materials), results, and efficiency across a broad range of attributes. Processes that once took hours, for example to heat an environment, can now be done immediately and with an almost-order-of-magnitude savings on energy. Furthermore, the process can apply to a broader range of materials than prior art process, and relieves the burdens associated with size limitations. When using a furnace, one is restrained by the size of the furnace, whereas the present invention can occur in an open environment free from indirect heating elements. Furthermore, the present invention allows selective processing in that you can treat only the components and subcomponents desired.

Turning now to FIG. 16, ceramics can have substantial uses within an organism 900 as an orthopedic insert. Articles created pursuant to the methods of the present invention can result in advantageous systems within an organism 900 as replacement or modification of a natural musculoskeletal component 310. Ceramics are notoriously unreactive within organic systems, and the natural defenses of an organism tend to be accepting of ceramic surfaces. A ceramic layer can be applied to an organism's natural musculoskeletal structures 312, or a ceramic article can be a replacement for a musculoskeletal component 312. An ideal musculoskeletal structure of the present invention includes bones, joints, cartilaginous structures, and external features. According to the present invention, an artificial musculoskeletal insert 310 can be fabricated to include an inexpensive, but durable material, along portions of the insert not-in-contact with other structures, but having ceramic end portions. This arrangement may be particularly advantageous in cup-and-ball joints (cup 310a, ball 310b) wherein the end portions of a bone accept greater stress than central portions of the bone. The ceramic end portions will result in an orthopedic insert having a significant life cycle relative to the prior art orthopedic inserts. Furthermore, it may be desirable to have an orthopedic insert for a cup-and-ball joint wherein merely the interior surface 120 of the "cup" joint is formed into a ceramic—or at least the upper surface of the inner surface.

Orthopedic implants materials play a more pivotal role than materials in most other ventures, excepting perhaps space and oceanic exploration. The choice of the implant material influences rigidity, corrosion, biocompatibility and tissue receptivity, while its surface morphology affects its stability within the skeleton or the surrounding mantle. Preferred attributes of implant materials for orthopedics include the following: chemically inert; biocompatible; great strength; high fatigue resistance; low elastic modulus; absolutely corrosion-proof; good wear resistance; inexpensive.

Metals used in orthopedic implants include surgical grade stainless steel (commonly 316L), cobalt-chromium (Co—Cr) alloys and pure commercial titanium (Ti) or titanium alloys. Stainless steel is often used for non-permanent implants, including internal fixation devices. Stainless steel, however, includes poor fatigue strength and liability to undergo plastic deformation. Before the use of titanium, cobalt-based alloys had largely replaced stainless steel as materials for permanent implants. These aforementioned alloys generally have excellent corrosion resistance, as they have a durable chromium oxide surface layer. Although these alloys may have good corrosion resistance, ion release within the organism subsequent to implant is a serious concern, as chromium, nickel and cobalt are believed to be carcinogenic in certain circumstances. Titanium use in orthopedic implants often involves pure commercial titanium and titanium alloys. These metals have been demonstrated to be highly biocompatible. Titanium and its alloys display better corrosion resistance than Co—Cr alloys, principally due to the formation of titanium oxide on the surface. This outer surface layer often has the characteristics of porosity and rather friable (i.e., easily crumbled or pulverizable). Abrasion of this titanium oxide layer can lead to the release of particles into the surrounding tissues. Although titanium implants have been considered to be the most biocompatible, these debris may can be linked to harmful tissue responses that can result in long-term aseptic loosening of the implant.

Common ceramics used in orthopedic implants include aluminium oxide and calcium phosphates. Such ceramic materials are very resistant to compression, but weak under tension and shear, and brittle. Ceramics have a very high modulus compared to bone (330.000 MPa). As is common with ceramics, the tradeoff is often considered undesirable because the ceramic implant may result in bone fracturing or early loosening of ceramic acetabular sockets because of the high noncompliant elastic modulus. Calcium phosphate ceramics are particularly attractive as implant coatings because of their high biocompatibility and reactivity. The present invention can eliminate the need to coat titanium and titanium alloys are coated with hydroxyapatite (HA). Calcium phosphate implant coatings have been shown to result in strong early porous implant fixation and early bone ingrowth. Other ceramic materials are commonly used, such as zirconium oxide (Zirconia) and silicon oxide (Silica).

The present invention will results in articles achieving ideal utility in extreme environments. As shown in FIG. 17, two extreme environments include space, above and oceanic environments. Space, for purposes of the present invention, includes environments beyond, or about, the Karmen line 320. Weightless and vacuum environments can be hazardous because particles and other entities conserve their energy status: for example, debris will maintain its state, whether stationary or in motion. Generally, any particle at any velocity can serve as a hazard when an entity contacting it is traveling at a significant velocity; and there are plenty of particles in space that are maintaining a significant momentum imparted upon it by some cosmic occurrence. Because small particles can have significant unimpeded momentum, the materials from which space vehicles are constructed require significant attention. Surfaces of the present invention are ideally applied to space craft, particularly miniaturized instruments. Because the present invention tolerates asynchronous and fine detailed application of ceramic surfaces, ceramic surfaces 906 can be applied to instruments subsequent to fabrication. In other words, disassembly is not required and a portable laser unit can apply ceramics to vehicles 904 already deployed. The present invention will result in excellent longevity to surfaces in space that are often involved in an unrelenting bombardment of particles.

The present invention also permits substantial utility in oceanic environments, or any other aqueous saline environment, which again can include organism systems. Ceramics have excellent resistance to corrosive aqueous environments, including oceans, swimming pools, chemical environments, and acidic environments. Aqueous environments 322 are notoriously harsh to tools and sensors 904. Ceramics are substantially unreactive to salts, even in concentrated circumstances. The application of the present invention to oceanic tools can be particularly advantageous because a ceramic layer 906 can be applied to a non-ceramic to take advantage of multiple properties of multiple materials. Ceramic layers can even by interspersed between non-ceramic layers.

Turning now to FIGS. 18A-18D, the present invention can result in a myriad of output architecture for articles 100. Because as discussed above the present invention can utilize controlled energy to create new patterns and geometries of ceramic surfaces, articles 100 fabricated using the processes disclosed herein can have multiple predesigned layers of strata. The processes described above that result in postformation construction of ceramic layers can be achieved agnostic to formation status. In other words, the application of energy for the transformation of a metal to a metal ceramic need not be coupled with the removal of material. If the process of the present invention were applied to a simplistic prism of material, the application of laser energy to the exterior surface of a metal (or non-ceramic) surface would result in an outer surface 120 having the ceramic attributes described above. The core 130 would remain non-ceramic, not having been the recipient of direct or nearby energy. However, there would further be an intermediate layer 150 that is a mixture of ceramic and metal-ceramic. This intermediate level is particularly noteworthy because it results in a gradient that changes in density from ceramic to metal as the layer approaches the core. Results have shown that the outer layer 120 at some depth is pure ceramic. By "pure" ceramic, it is meant ceramic to a degree that the non-ceramic constitutes of the layer are statistically insignificant for purposes of determining the attributes thereof. Accordingly the outer layer is purely ceramic, but one of the primary attributes of the conversion of the present invention is the obviation of a discrete "coating." Rather than applying a coating, which relies on adhesion to remain a part of the article, the present invention "converts" some outer portion of an article to a ceramic exterior. There is nothing to peel off.

Although there is nothing to peel, there is a generally uniform (if desired) geometry of a ceramic layer. The depth of the outer layer is strongly dependent upon the energy used to apply the ceramic to the exterior of the article 100. It is generally correct to surmise that the greater amount of energy applied to the outer layer aids in controlling deterministically the depth of the outer layer as a ceramic layer; however, it is more accurate to say that the relationship is more of one of power and application-duration. Over-application of energy to the outer layer results in the 'boiling' away of the newly formed ceramic layer. Ceramics may be tough, but the over-application of energy over short durations of time destroy the ceramic. This is the significance of the pulsed application of energy; as more energy is utilized over a greater expanse of time, the depth of the outer layer can be controlled. For different materials and lasers, the relationship can be determined experimentally—and thus far has worked best that way.

At the extent of the depth of the outer layer, there is a discrete change from pure ceramic to mostly-ceramic. This 'mostly-ceramic' layer is the intermediate layer 150 wherein the some proportion of ceramic to metal transitions to a lower proportion until another discrete layer, the core layer 130 is encountered wherein the ratio of ceramic to non-ceramic is approximately zero. Again, "pure" metal is the point at which the appearance of ceramic materials results in statistically insignificant appearance of ceramic properties. The degree of the transition of the gradient can be finely controlled by application of the energy to the exterior of the article 100. The application of laser energy over longer periods of time results in a larger intermediate layer 150 that transitions from ceramic to metal at a more gradual transition, whereas the shorter application of energy over time results in a smaller gradient with a more rapid transition from ceramic to metal.

Accordingly by controlling the amount of energy and the amount of time over which that energy is applied (and the use of pulsation), the present invention can result in articles with deterministic outer layers, intermediate layers, and core layers. For the first time, the present invention results in a postformed ceramic layers wherein unseen layers can include the gradient attributes that may be advantageous for particular applications. For example, in FIG. 18A, the article 100 was apparently treated substantially uniformed regarding the application of energy. The paths across the layers were apparently uniform in energy and duration. FIG. 18B tells a different story, the application of energy relative to the duration of the energy application resulted in a greater depth of ceramic rightward. Leftward, however, the energy was applied to a greater degree but over a more extended period of time (relatively) to result in a deeper intermediate layer. Such an article may be desirable wherein the leftward portions may be exposed to more-corrosive environments whereas the rightward portions may be subject to greater stress. FIG. 18C tells a similar story wherein the greatest ratio of energy to duration is at the leftward and rightward portions, wherein the center of the article maintains the greater degree of intermediate layer due to the more controlled exposure to energy over longer periods of time. As 18D shows, because the energy application is finely controlled, the layers themselves do not need to be gradually applied.

Without further elaboration, it is believed that a person skilled in the art can, using the present description, including the examples, utilize the present invention to its fullest extent. Also, although the invention has been described herein with regard to its preferred embodiments, which constitute the best mode presently known to the inventors, it should be understood that various changes and modifications as would be obvious to one having the ordinary skill in this art may be made without departing from the scope of the invention which is set forth in the claims appended hereto.

Thus, while various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A method for creating a metal ceramic article comprising:
    providing a metal-oxide workpiece having an outer layer, with an outer layer depth, of a substantially isotropic metal-ceramic to a waste depth of said workpiece;
    machining a target volume of said workpiece to shape said workpiece into a predetermined final article volume, composed of an original surface and a machined surface, having a substantially isotropic metal-ceramic surface; and
    emitting directed energy upon said machined surface for spot travel surface and a duration sufficient to impart a comparable hardness between said original surface and said machined surface to result in (i) a core consisting of a metal; (ii) an intermediate layer, enveloping said core, consisting of a mixture of said metal and a ceramic of said metal arranged in a gradient of diminishing ceramic relative to said core; and (iii) an outer layer, enveloping said intermediate layer, consisting of said ceramic.

2. The method of claim 1 wherein said emitting step includes light-energization of said target volume.

3. The method of claim 2 wherein said emitting step includes light-energization of said target volume using overlapping paths.

4. The method of claim 2 wherein said emitting step includes pulse light-energization of said target volume.

5. The method of claim 2 wherein said emitting step includes a scrolling rate for a beam providing said light-energization at a rate in excess of 1 m/s.

6. The method of claim 5 wherein said emitting step includes said scrolling rate in excess of 10 m/s.

7. The method of claim 1 wherein said machining step includes machining said target volume to a waste depth greater than 50% of said outer layer depth.

8. The method of claim 7 wherein said machining step includes machining said target volume to a waste depth greater than 75% of said outer layer depth.

9. The method of claim 8 wherein said machining step includes machining said target volume to a waste depth greater than 75% of said outer layer depth.

* * * * *